United States Patent
Koppe

(10) Patent No.: US 7,825,326 B2
(45) Date of Patent: Nov. 2, 2010

(54) POLYMER PHOTOVOLTAIC CELL

(75) Inventor: Markus Koppe, Linz (AT)

(73) Assignee: Konarka Technologies, Inc., Lowell, MA (US)

( * ) Notice: Subject to any disclaimer, the term of this patent is extended or adjusted under 35 U.S.C. 154(b) by 1256 days.

(21) Appl. No.: 11/374,329

(22) Filed: Mar. 13, 2006

(65) Prior Publication Data

US 2007/0062577 A1    Mar. 22, 2007

Related U.S. Application Data

(60) Provisional application No. 60/664,114, filed on Mar. 21, 2005.

(51) Int. Cl.
    *H02N 6/00* (2006.01)
(52) U.S. Cl. .............. 136/246; 136/243; 136/263; 438/99; 977/734; 977/735
(58) Field of Classification Search ............ 136/246, 136/243, 263; 438/99; 977/734, 735
    See application file for complete search history.

(56) References Cited

U.S. PATENT DOCUMENTS 6,147,295 A * 11/2000 Mimura et al. ............ 136/246
6,489,044 B1   12/2002 Chen et al.
7,605,327 B2 * 10/2009 Roscheisen et al. ........ 136/263
2006/0105491 A1  5/2006 Brabec et al.
2006/0278890 A1 12/2006 Brabec et al.

FOREIGN PATENT DOCUMENTS

DE      10326546      1/2005
EP      1447860 A1    8/2004
WO   WO 2004/025746   3/2004

OTHER PUBLICATIONS

Neugebauer et al, "Stability and photodegradation mechanisms of conjugated polymer/fullerene plastic solar cells," Solar Energy Materials and Solar Cells, 61:35-42, 2000.
Website http://www.partsonsale.com/learnwiring.htm from Feb. 6, 2003. Available from www.archive.org. (6 pages), especially pp. 4 and 5.
Yang, S.C. et al., "Preparation of Oxygenated Fullerene Thin Film for Photoelectric Devices", Japanese Journal of Applied Physics, vol. 40, No. 2B, Part 01, (Feb. 1, 2001), pp. 1067-1069.
Extended Search Report issued on Jul. 20, 2010 in European Application No. 06738117.8.

* cited by examiner

*Primary Examiner*—Alexa D Neckel
*Assistant Examiner*—Xiuyu Tai
(74) *Attorney, Agent, or Firm*—Fish & Richardson P.C.

(57) ABSTRACT

This disclosure relates to a photovoltaic cell that includes a first electrode, a second electrode, and an active layer disposed between the first and second electrodes. The active layer includes two different fullerenes. The weight ratio of the first fullerene to the second fullerene is at least about 1:20.

38 Claims, 1 Drawing Sheet

POLYMER PHOTOVOLTAIC CELL

CROSS REFERENCE TO RELATED APPLICATION

Pursuant to 35 U.S.C. §119(e), this application claims priority to U.S. Provisional Application Ser. No. 60/664,114, filed Mar. 21, 2005, the contents of which are hereby incorporated by reference.

TECHNICAL FIELD

This invention relates to polymer photovoltaic cells, as well as related modules and methods.

BACKGROUND

Polymer photovoltaic cells may be used to convert solar energy to electrical energy. Such cells generally include a photoactive layer that contains an electron donor material and an electron acceptor material.

SUMMARY

This invention relates to polymer photovoltaic cells, as well as related modules and methods.

In one aspect, this invention features a photovoltaic cell that includes a first electrode, a second electrode, and an active layer disposed between the first and second electrodes. The active layer includes two different fullerenes. The weight ratio of the first fullerene to the second fullerene is at least about 1:20.

In another aspect, this invention features a photovoltaic cell that includes two electrodes and an active layer between the two electrodes. The efficiency of the photovoltaic cell after being heated at a temperature of at least about 50° C. for at least about 5 minutes is at least about 50% of the efficiency of the photovoltaic cell before being heated.

In a further aspect, this invention features a module that includes a plurality of photovoltaic cells (e.g., one or more of the forgoing photovoltaic cells). At least some of the photovoltaic cells are electrically connected (e.g., some of the cells are connected in series and/or some of the cells are connected in parallel).

Embodiments can include one or more of the following features.

One of the fullerenes can be an unsubstituted fullerene, such as $C_{60}$, $C_{70}$, $C_{76}$, $C_{78}$, $C_{82}$, $C_{84}$, or $C_{92}$, and/or the other fullerene can be a substituted fullerene, such as a fullerene containing an ester group. Examples of substituted fullerene includes C61-phenyl-butyric acid methyl ester (PCBM) and C61-phenyl-butyric acid glycidol ester (PCBG). In some embodiments, the first fullerene and the second fullerene can be substantially non-phase separated.

The weight ratio of the two fullerenes can be at least about 1:10 (e.g., at least about 1:5, at least about 1:3, or at least about 1:1) and/or at most about 3:1.

The photovoltaic cell can have an efficiency of at least about 0.5% (e.g., at least about 1% or at least about 2%).

The efficiency of the photovoltaic cell after being heated at a temperature of at least about 50° C. for at least about 5 minutes can be at least about 50% (e.g., at least about 80%, at least about 90%) of the efficiency of the photovoltaic cell before being heated.

The active layer can further include an electron donor material. Exemplary electron donor materials include polyacetylene, polyaniline, polyphenylene, poly(p-phenylene vinylene), polythienylvinylene, polythiophene, polyporphyrin, porphyrinic macrocycle, polymetallocene, polyisothianaphthalene, polyphthalocyanine, a discotic liquid crystal polymer, derivatives thereof and/or combinations thereof.

Other features and advantages of the invention will be apparent from the description, drawings, and claims.

DESCRIPTION OF DRAWINGS

Like reference symbols in the various drawings indicate like elements.

DETAILED DESCRIPTION

Figure 1:
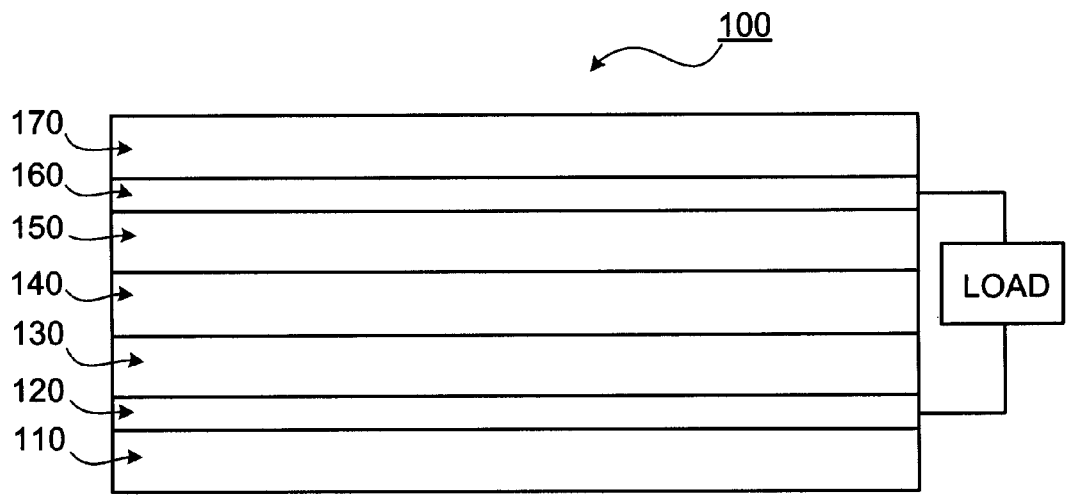
FIG. 1 is a cross-sectional view of an embodiment of a photovoltaic cell.

FIG. 1 shows a cross-sectional view of a photovoltaic cell 100 that includes a substrate 110, a cathode 120, a hole carrier layer 130, an active layer 140 (containing an electron acceptor material and an electron donor material), a hole blocking layer 150, an anode 160, and a substrate 170.

In general, during use, light impinges on the surface of substrate 110, and passes through substrate 110, cathode 120, and hole carrier layer 130. The light then interacts with active layer 140, causing electrons to be transferred from the electron donor material to the electron acceptor material. The electron acceptor material then transmits the electrons through hole blocking layer 150 to anode 160, and the electron donor material transfers holes through hole carrier layer 130 to cathode 120. Anode 160 and cathode 120 are in electrical connection via an external load so that electrons pass from anode 160, through the load, and to cathode 120.

Electron acceptor materials of active layer 140 can include fullerenes. In some embodiments, active layer 140 can include one or more unsubstituted fullerenes and one or more substituted fullerenes. Examples of unsubstituted fullerenes include $C_{60}$, $C_{70}$, $C_{76}$, $C_{78}$, $C_{82}$, $C_{84}$, and $C_{92}$. Examples of substituted fullerenes include PCBM and PCBG.

As used herein, the term "fullerene" means a compound, e.g., a molecule, including a three-dimensional carbon skeleton having a plurality of carbon atoms. The carbon skeleton of such fullerenes generally forms a closed shell, which may be, e.g., spherical or semi-spherical in shape. Alternatively, the carbon skeleton may form an incompletely closed shell, such as, e.g., a tubular shape. Carbon atoms of fullerenes are generally linked to three nearest neighbors in a tetrahedral network. The term "fullerene" includes both unsubstituted and substituted fullerenes.

Unsubstituted fullerenes may be designated as $C_j$, where j is an integer related to the number of carbon atoms of the carbon skeleton. For example, $C_{60}$ defines a truncated icosahedron including 32 faces, of which 12 are pentagonal and 20 are hexagonal. Other suitable fullerenes include, e.g., $C_j$ where j may be at least 50 and may be less than about 250. Unsubstituted fullerenes can generally be produced by the high temperature reaction of a carbon source, such as elemental carbon or carbon containing species. For example, sufficiently high temperatures may be created using laser vaporization, an electric arc, or a flame. Subjecting a carbon source to high temperatures forms a carbonaceous deposit from which various unsubstituted fullerenes are obtained. Typically, the unsubstituted fullerenes can be purified using a combination of solvent extraction and chromatography.

Substituted fullerenes include fullerenes containing one or more substituents, such as PCBM and PCBG Examples of suitable substituents include alkyl, alkenyl, alkynyl, cycloalkyl, cycloalkenyl, alkoxy, aryl, aryloxy, heteroaryl, heteroaryloxy, amino, alkylamino, dialkylamino, arylamino, diarylamino, hydroxyl, halogen, thio, alkylthio, arylthio, alkylsulfonyl, arylsulfonyl, cyano, nitro, acyl, acyloxy, carboxyl, and carboxylic ester. These substituents can be further substituted by one or more suitable substituents. Substituted fullerenes can be prepared by any suitable methods. For example, alkylfullerene derivatives can be prepared by reacting fullerenes with organic alkyl lithium or alkyl Grignard reagents and then with alkyl halides. As another example, PCBM can be prepared by reacting $C_{60}$ with methyl 4-benzoylbutyrate p-tosylhydrazone in the presence of a base. PCBM can be further modified to obtain other substituted fullerenes (e.g., PCBG).

Without wishing to be bound by any theory, it is believed that a photovoltaic cell containing a mixture of one or more unsubstituted fullerenes and one or more substituted fullerenes in active layer 140 can exhibit enhanced thermal stability. For example, after being heated at an elevated temperature for a period of time, a photovoltaic cell containing a mixture of one or more unsubstituted fullerenes and one or more substituted fullerenes can undergo a relatively small change in efficiency.

In general, the weight ratio of the unsubstituted fullerene to the substituted fullerene can be varied as desired. In certain embodiments, the weight ratio of the unsubstituted fullerene to the substituted fullerene can be at least about 1:20 (e.g., at least about 1:10, at least about 1:5, at least about 1:3, or at least about 1:1) and/or at most about 10:1 (e.g., at most about 5:1 or at most about 3:1).

In some embodiments, the efficiency of photovoltaic cell 100 after being heated at a temperature of at least about 50° C. (e.g., at least about 100° C., at least about 150° C., at least about 170° C., at least about 200° C., at least about 225° C.) for at least about 5 minutes (e.g., at least about 10 minutes, at least about 15 minutes, at least about 20 minutes, at least about 30 minutes, at least about 60 minutes, at least about 120 minutes) is at least about 50% (e.g., at least about 60%, at least about 70%, at least about 80%, at least about 90%, at least about 95%, at least about 98%) of the efficiency before being heated.

Photovoltaic cell 100 can have an efficiency of at least about 0.5% (e.g., at least about 1%, at least about 2%, at least about 3%, or at least about 4%). The efficiency of a photovoltaic cell refers to the ratio of the solar energy that reaches the cell to the electrical energy that is produced by the cell. Efficiency of a photovoltaic cell can be obtained by methods known in the art. For example, it can be determined from a current-voltage curve derived based on a photovoltaic cell. In some embodiments, the unsubstituted fullerene and the substituted fullerene in active layer 140 can be substantially non-phase separated.

In some embodiments, active layer 140 can include one or more non-fullerene electron acceptor materials. Examples of suitable electron acceptor materials include oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups).

Electron donor materials of active layer 140 can include conducting polymers (e.g., a conjugated organic polymer), which generally have a conjugated portion. Conjugated polymers are characterized in that they have overlapping π orbitals, which contribute to the conductive properties. Conjugated polymers may also be characterized in that they can assume two or more resonance structures. The conjugated organic polymer may be, e.g., linear or branched, so long as the polymer retains its conjugated nature.

Examples of suitable electron donor materials include one or more of polyacetylene, polyaniline, polyphenylene, poly (p-phenylene vinylene), polythienylvinylene, polythiophene, polyporphyrins, porphyrinic macrocycles, polymetallocenes, polyisothianaphthalene, polyphthalocyanine, a discotic liquid crystal polymer, and a derivative or a combination thereof. Exemplary derivatives of the electron donor materials include derivatives having pendant groups, e.g., a cyclic ether, such as epoxy, oxetane, furan, or cyclohexene oxide. Derivatives of these materials may alternatively or additionally include other substituents. For example, thiophene components of electron donor may include a phenyl group, such as at the 3 position of each thiophene moiety. As another example, alkyl, alkoxy, cyano, amino, and/or hydroxy substituent groups may be present in any of the polyphenylacetylene, polydiphenylacetylene, polythiophene, and poly(p-phenylene vinylene) conjugated polymers. In some embodiments, the electron donor material is poly(3-hexylthiophene) (P3HT). In certain embodiments, active layer 140 can include a combination of electron donor materials.

In some embodiments, active layer 140 includes an oriented electron donor material (e.g., a liquid crystal (LC) material), an electroactive polymeric binder carrier (e.g., P3HT), and a plurality of nanocrystals (e.g., oriented nanorods including at least one of ZnO, $WO_3$, or $TiO_2$). The liquid crystal material can be, for example, a discotic nematic LC material, including a plurality of discotic mesogen units. Each unit can include a central group and a plurality of electroactive arms. The central group can include at least one aromatic ring (e.g., an anthracene group). Each electroactive arm can include a plurality of thiophene moieties and a plurality of alkyl moities. Within the photoactive layer, the units can align in layers and columns. Electroactive arms of units in adjacent columns can interdigitate with one another facilitating electron transfer between units. Also, the electroactive polymeric carrier can be distributed amongst the LC material to further facilitate electron transfer. The surface of each nanocrystal can include a plurality of electroactive surfactant groups to facilitate electron transfer from the LC material and polymeric carrier to the nanocrystals. Each surfactant group can include a plurality of thiophene groups. Each surfactant can be bound to the nanocrystal via, for example, a phosphonic end-group. Each surfactant group also can include a plurality of alkyl moieties to enhance solubility of the nanocrystals in the photoactive layer.

Turning now to other components of photovoltaic cell 100, substrate 110 is typically formed of a transparent material. As referred to herein, a transparent material is a material, which, at the thickness used in a photovoltaic cell 100, transmits at least about 60% (e.g., at least about 70%, at least about 75%, at least about 80%, or at least about 85%) of incident light at a wavelength or a range of wavelengths used during operation of the photovoltaic cell. An exemplary wavelength or range of wavelengths occurs between about 300 nanometers and about 850 nanometers.

Exemplary materials from which substrate 110 can be formed include polyethylene terephthalates, polyimides, polyethylene naphthalates, polymeric hydrocarbons, cellulosic polymers, polycarbonates, polyamides, polyethers, polyether ketones, and derivatives thereof including copolymers of such materials. In certain embodiments, the polymer can be a fluorocarbon, e.g., a fluorocarbon ether. In some embodiments, combinations of polymeric materials are used. In certain embodiments, different regions of substrate 110 can be formed of different materials.

In general, substrate 110 can be flexible, semi-rigid, or rigid (e.g., glass). In some embodiments, substrate 110 has a flexural modulus of less than about 5,000 megaPascals.

In certain embodiments, different regions of substrate 110 can be flexible, semi-rigid, or inflexible (e.g., one or more regions flexible and one or more different regions semi-rigid, or one or more regions flexible and one or more different regions inflexible).

Typically, substrate 110 is at least about 1 micron (e.g., at least about 5 microns or at least about 10 microns) thick and/or at most about 1,000 microns (e.g., at most about 500 microns thick, at most about 300 microns thick, at most about 200 microns thick, at most about 100 microns, or at most about 50 microns) thick.

Generally, substrate 110 can be colored or non-colored. In some embodiments, one or more portions of substrate 110 is/are colored while one or more different portions of substrate 110 is/are non-colored.

Substrate 110 can have one planar surface (e.g., the surface on which light impinges), two planar surfaces (e.g., the surface on which light impinges and the opposite surface), or no planar surfaces. A non-planar surface of substrate 110 can, for example, be curved or stepped. In some embodiments, a non-planar surface of substrate 110 is patterned (e.g., having patterned steps to form a Fresnel lens, a lenticular lens or a lenticular prism).

Either or both of cathode 120 and anode 160 may be configured to transmit at least a portion of light impinging thereon. For example, at least one of cathode 120 and anode 160 may be formed of a transmissive material. An exemplary transmissive material includes a transmissive oxide, such as a tin oxide, e.g., indium-doped tin oxide (ITO). As an alternative to or in conjunction with a transmissive material, cathode 120 may be configured with open areas to allow light to pass through and closed areas defined by a conductive material that conducts electrons. In one embodiment, at least one of cathode 120 and anode 160 is a mesh. Photovoltaic cells having mesh electrodes are disclosed, for example, in co-pending and commonly owned U.S. Utility applications Ser. Nos. 10/395,823, 10/723,554, and 10/494,560, each of which is hereby incorporated by reference.

Hole carrier layer 130 is generally formed of a material that, at the thickness used in photovoltaic cell 100, transports holes to electrode 120 and substantially blocks the transport of electrons to electrode 120. Examples of materials from which layer 130 can be formed include polythiophenes (e.g., poly(3,4-ethylenedioxythiophene)), polyanilines, polyvinylcarbazoles, polyphenylenes, polyphenylvinylenes, polysilanes, polythienylenevinylenes and/or polyisothianaphthanenes. In some embodiments, hole carrier layer 130 can include combinations of hole carrier materials.

In general, the distance between the upper surface of hole carrier layer 130 (i.e., the surface of hole carrier layer 130 in contact with photoactive layer 140) and the upper surface of electrode 120 (i.e., the surface of electrode 120 in contact with hole carrier layer 130) can be varied as desired. Typically, the distance between the upper surface of hole carrier layer 130 and the upper surface of electrode 120 is at least 0.01 micron (e.g., at least about 0.05 micron, at least about 0.1 micron, at least about 0.2 micron, at least about 0.3 micron, or at least about 0.5 micron) and/or at most about 5 microns (e.g., at most about 3 microns, at most about 2 microns, or at most about 1 micron). In some embodiments, the distance between the upper surface of hole carrier layer 130 and the upper surface of electrode 120 is from about 0.01 micron to about 0.5 micron.

Generally, active layer 140 is sufficiently thick to be relatively efficient at absorbing photons impinging thereon to form corresponding electrons and holes, and sufficiently thin to be relatively efficient at transporting the holes and electrons to electrodes of the device. In certain embodiments, layer 140 is at least 0.05 micron (e.g., at least about 0.1 micron, at least about 0.2 micron, or at least about 0.3 micron) thick and/or at most about 1 micron (e.g., at most about 0.5 micron or at most about 0.4 micron) thick. In some embodiments, layer 140 is from about 0.1 micron to about 0.2 micron thick.

Hole blocking layer 150 is generally formed of a material that, at the thickness used in photovoltaic cell 100, transports electrons to anode 160 and substantially blocks the transport of holes to anode 160. Examples of materials from which layer 150 can be formed include LiF and metal oxides (e.g., zinc oxide, titanium oxide).

Typically, hole blocking layer 150 is at least 0.02 micron (e.g., at least about 0.03 micron, at least about 0.04 micron, or at least about 0.05 micron) thick and/or at most about 0.5 micron (e.g., at most about 0.4 micron, at most about 0.3 micron, at most about 0.2 micron, or at most about 0.1 micron) thick.

Substrate 170 can be formed of a transparent material or a non-transparent material. For example, in embodiments in which a photovoltaic cell uses light that passes through anode 160 during operation, substrate 170 is desirably formed of a transparent material. Substrate 170 can be either identical to or different from substrate 110 mentioned above. Generally, substrate 170 is substantially non-scattering.

In some embodiments, a photovoltaic cell can be prepared as follows. Anode 160 is formed on substrate 170 using conventional techniques, and hole-blocking layer 150 is formed on anode 160 (e.g., using a vacuum deposition process or a solution coating process). Active layer 140 is formed on hole-blocking layer 150 using a suitable process, such as, ink jet printing, spin coating, dip coating, knife coating, bar coating, spray coating, roller coating, slot coating, gravure coating, or screen printing. Hole carrier layer 130 is formed on active layer 140 using, for example, a solution coating process. Cathode 120 is partially disposed in hole carrier layer 130 (e.g., by disposing cathode 120 on the surface of hole carrier layer 130, and pressing cathode 120). Substrate 110 is then formed on cathode 120 and hole carrier layer 130 using conventional methods.

This invention also features a photovoltaic module that includes a plurality of photovoltaic cells. At least some of the photovoltaic cells are electrically connected. The photovoltaic module can generally be used as a component in any intended systems. Examples of such systems include roofing, package labeling, battery chargers, sensors, window shades and blinds, awnings, opaque or semitransparent windows, and exterior wall panels.

The following examples are illustrative and not intended to be limiting.

EXAMPLES

Six photovoltaic cells containing different electron acceptor materials were prepared and tested: (1) a photovoltaic cell containing PCBM alone, (2) a photovoltaic cell containing PCBM and $C_{60}$ in a weight ratio of 20:1, (3) a photovoltaic cell containing PCBM and $C_{60}$ in a weight ratio of 9:1, (4) a photovoltaic cell containing PCBM and $C_{60}$ in a weight ratio of 3:1, (5) a photovoltaic cell containing PCBM and $C_{60}$ in a weight ratio of 1:1, and (6) a photovoltaic cell containing PCBM and $C_{60}$ in a weight ratio of 1:3.

Specifically, 20 mg of P3HT and 18.8 mg of the above-mentioned fullerene(s) were dissolved in an organic solvent, such as xylene or chlorobenzene, and deposited on a structured glass-ITO-poly(3,4-ethylenedioxythiophene):poly (styrene sulfonate) substrate. A LiF layer and an aluminum layer were subsequently deposited by evaporation as a top-electrode. Details on the cell preparation can be found in Padinger et al. *Adv. Functl. Mat.*, 2003, 13, p.1. The efficiency of the photovoltaic cell thus prepared was determined from a current-voltage curve measured by a Keithley 2400 unit under an illumination intensity of 800 W/m² (AM 1.5) delivered by an ORIEL solar simulator. Subsequently, the photovoltaic cell was placed on a hot plate and heated at 170° C. for 15 minutes. After it was allowed to cool down to room temperature, the efficiency was measured again. The efficiency of the photovoltaic cell was measured one more time after it was heated at 170° C. for another 15 minutes and cooled down to room temperature.

Figure 2:
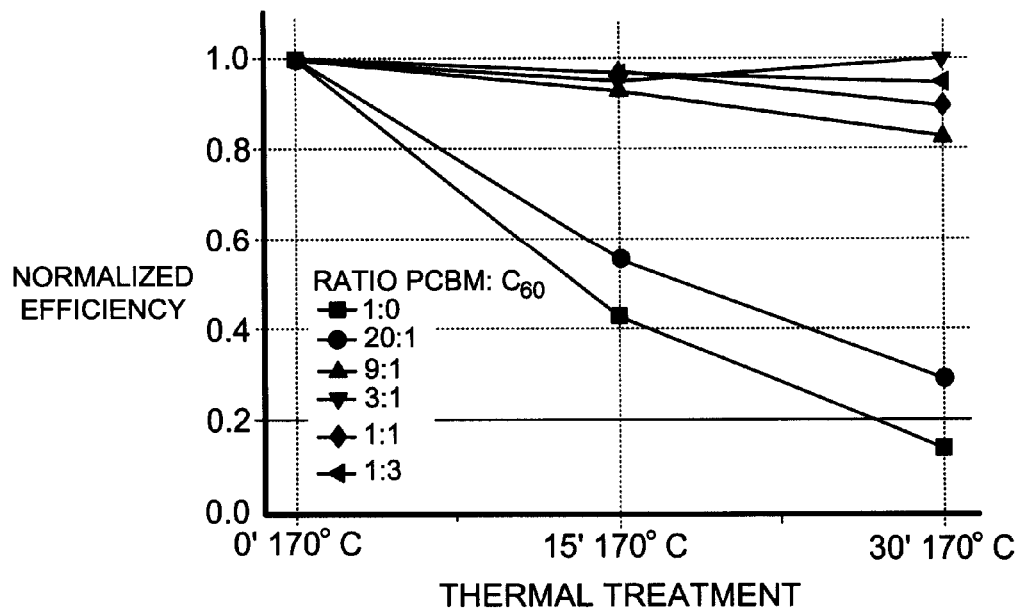
FIG. 2 is a graph showing the efficiency changes of photovoltaic cells after being heated under certain conditions.

The experimental results were summarized in FIG. 2. As shown in FIG. 2, after being heated at 170° C. for 15 minutes, the efficiency of photovoltaic cell (1) was about 45% of the efficiency before the heat treatment. The efficiency of photovoltaic cell (2) was about 57% of the efficiency before the heat treatment and the efficiency of each of photovoltaic cells (3), (4), (5) and (6) was about 95% of the efficiency before the heat treatment. Further, after being heated at 170° C. for 30 minutes, the efficiency of photovoltaic cell (1) was about 16% of the efficiency before the heat treatment. The efficiency of photovoltaic cell (2) was about 30% of the efficiency before the heat treatment and the efficiency of each of photovoltaic cells (3), (4), (5) and (6) was more than 80% of the efficiency before the heat treatment.

Other embodiments are in the claims.

What is claimed is:

1. A photovoltaic cell, comprising:
   a first electrode;
   a second electrode; and
   an active layer disposed between the first and second electrodes, the active layer comprising a first fullerene and a second fullerene different from the first fullerene, and a weight ratio of the first fullerene to the second fullerene being at least about 1:20,
   wherein the first fullerene is an unsubstituted fullerene selected from the group consisting of $C_{60}$, $C_{70}$, $C_{76}$, $C_{82}$, $C_{84}$, and $C_{92}$, and the second fullerene selected from the group consisting of PCBM and PCBG is a substituted fullerene.

2. The photovoltaic cell of claim 1, wherein the weight ratio is at least about 1:10.

3. The photovoltaic cell of claim 1, wherein the weight ratio is at least about 1:5.

4. The photovoltaic cell of claim 1, wherein the weight ratio is at least about 1:3.

5. The photovoltaic cell of claim 1, wherein the weight ratio is at least about 1:1.

6. The photovoltaic cell of claim 1, wherein the weight ratio is at most about 3:1.

7. The photovoltaic cell of claim 1, wherein the weight ratio is at least about 1:9.

8. The photovoltaic cell of claim 1, wherein the photovoltaic cell has an efficiency of at least about 0.5%.

9. The photovoltaic cell of claim 1, wherein the photovoltaic cell has an efficiency of at least about 1%.

10. The photovoltaic cell of claim 1, wherein the photovoltaic cell has an efficiency of at least about 2%.

11. The photovoltaic cell of claim 1, wherein the photovoltaic cell has a first efficiency before being heated and a second efficiency after being heated at a temperature of at least about 50° C. for at least about 5 minutes, and the second efficiency is at least about 50% of the first efficiency.

12. The photovoltaic cell of claim 1, wherein the photovoltaic cell has a first efficiency before being heated and a second efficiency after being heated at a temperature of at least about 50° C. for at least about 5 minutes, and the second efficiency is at least about 80% of the first efficiency.

13. The photovoltaic cell of claim 1, wherein the photovoltaic cell has a first efficiency before being heated and a second efficiency after being heated at a temperature of at least about 50° C. for at least about 5 minutes, and the second efficiency is at least about 90% of the first efficiency.

14. The photovoltaic cell of claim 1, wherein the first fullerene and the second fullerene are substantially non-phase separated.

15. The photovoltaic cell of claim 1, wherein the active layer further comprises an electron donor material.

16. The photovoltaic cell of claim 15, wherein the electron donor material comprises polyacetylene, polyaniline, polyphenylene, poly(p-phenylene vinylene), polythienylvinylene, polythiophene, polyporphyrin, porphyrinic macrocycle, polymetallocene, polyisothianaphthalene, polyphthalocyanine, a discotic liquid crystal polymer, or a derivative thereof.

17. A module, comprising a plurality of the photovoltaic cells of claim 1, at least some of the photovoltaic cells being electrically connected.

18. The module of claim 17, wherein at least some of the cells are connected in series.

19. The module of claim 17, wherein at least some of the cells are connected in parallel.

20. A photovoltaic cell, comprising:
   a first electrode;
   a second electrode; and
   an active layer disposed between the first and second electrodes;
   wherein the active layer comprises a first fullerene and a second fullerene different from the first fullerene, the first fullerene is an unsubstituted fullerene selected from the group consisting of $C_{60}$, $C_{70}$, $C_{76}$, $C_{82}$, $C_{84}$, and $C_{92}$, the second fullerene is substituted fullerene selected form the group consisting of PCBM and PCBG, a weight ratio of the first fullerene to the second fullerene is at least about 1:20, the photovoltaic cell has a first efficiency before being heated and a second efficiency after being heated to a temperature of at least about 50° C. for at least about 5 minutes, and the second efficiency is at least about 50% of the first efficiency.

21. The photovoltaic cell of claim 20, wherein the first fullerene and the second fullerene are substantially non-phase separated.

22. The photovoltaic cell of claim 20, wherein the weight ratio is at least about 1:10.

23. The photovoltaic cell of claim 22, wherein the weight ratio is at least about 1:5.

24. The photovoltaic cell of claim 22, wherein the weight ratio is at least about 1:3.

25. The photovoltaic cell of claim 22, wherein the weight ratio is at least about 1:1.

26. The photovoltaic cell of claim 22, wherein the weight ratio is at most about 3:1.

27. The photovoltaic cell of claim 22, wherein the weight ratio is at least about 1:9.

28. The photovoltaic cell of claim 22, wherein the first fullerene and the second fullerene are substantially non-phase separated.

29. The photovoltaic cell of claim 20, wherein the first efficiency is at least about 0.5%.

30. The photovoltaic cell of claim 20, wherein the first efficiency is at least about 1%.

31. The photovoltaic cell of claim 20, wherein the first efficiency is at least about 2%.

32. The photovoltaic cell of claim 20, wherein the second efficiency is at least about 80% of the first efficiency.

33. The photovoltaic cell of claim 20, wherein the second efficiency is at least about 90% of the first efficiency.

34. The photovoltaic cell of claim 20, wherein the active layer further comprises an electron donor material.

35. The photovoltaic cell of claim 34, wherein the electron donor material comprises polyacetylene, polyaniline, polyphenylene, poly(p-phenylene vinylene), polythienylvinylene, polythiophene, polyporphyrin, porphyrinic macrocycle, polymetallocene, polyisothianaphthalene, polyphthalocyanine, a discotic liquid crystal polymer, or a derivative thereof.

36. A module, comprising a plurality of the photovoltaic cells of claim 20, at least some of the photovoltaic cells being electrically connected.

37. The module of claim 36, wherein at least some of the cells are connected in series.

38. The module of claim 36, wherein at least some of the cells are connected in parallel.

* * * * *

UNITED STATES PATENT AND TRADEMARK OFFICE
CERTIFICATE OF CORRECTION

| | | |
|---|---|---|
| PATENT NO. | : 7,825,326 B2 | |
| APPLICATION NO. | : 11/374329 | |
| DATED | : November 2, 2010 | |
| INVENTOR(S) | : Markus Koppe | |

It is certified that error appears in the above-identified patent and that said Letters Patent is hereby corrected as shown below:

Column 7,
Line 51, delete "fullerene selected" and insert --fullerene is a substituted fullerene selected--

Column 7,
Line 52-53, delete "PCBG is a substituted fullerene." and insert --PCBG.--

Column 8,
Line 49, after "fullerene is" insert --a--

Column 8,
Line 50, delete "form" and insert --from--

Signed and Sealed this
Eighteenth Day of January, 2011

David J. Kappos
*Director of the United States Patent and Trademark Office*